US008773345B2

(12) United States Patent
Lebrun et al.

(10) Patent No.: US 8,773,345 B2
(45) Date of Patent: Jul. 8, 2014

(54) FIELD-EFFECT TRANSISTOR SHIFT REGISTER

(75) Inventors: Hugues Lebrun, Coublevie (FR); Thierry Kretz, Saint Jean de Moirans (FR); Chantal Hordequin, Veurey Voroize (FR)

(73) Assignee: Thales, Neuilly sur Seine (FR)

( * ) Notice: Subject to any disclaimer, the term of this patent is extended or adjusted under 35 U.S.C. 154(b) by 325 days.

(21) Appl. No.: 13/057,538

(22) PCT Filed: Aug. 4, 2009

(86) PCT No.: PCT/EP2009/060083
§ 371 (c)(1),
(2), (4) Date: Feb. 4, 2011

(87) PCT Pub. No.: WO2010/015621
PCT Pub. Date: Feb. 11, 2010

(65) Prior Publication Data
US 2011/0134107 A1  Jun. 9, 2011

(30) Foreign Application Priority Data

Aug. 8, 2008  (FR) ..................................... 08 04537

(51) Int. Cl.
*G11C 19/00* (2006.01)
*G11C 19/18* (2006.01)
*G11C 19/28* (2006.01)

(52) U.S. Cl.
CPC .................................. *G11C 19/28* (2013.01);
*G11C 19/184* (2013.01)
USPC ............ 345/100; 345/204; 345/213; 345/690

(58) Field of Classification Search
USPC ................................... 345/100, 204, 213, 690
See application file for complete search history.

(56) References Cited

U.S. PATENT DOCUMENTS

| 5,517,542 A * | 5/1996 | Huq ............................... 377/78 |
| 5,606,194 A | 2/1997 | Lebrun et al. |
| 5,701,136 A * | 12/1997 | Huq et al. ...................... 345/100 |
| 6,064,713 A | 5/2000 | Lebrun et al. |
| 6,359,608 B1 | 3/2002 | Lebrun et al. |
| 6,611,311 B1 | 8/2003 | Kretz et al. |
| 6,924,785 B1 | 8/2005 | Kretz et al. |
| 6,972,747 B2 | 12/2005 | Bayot et al. |
| 6,977,638 B1 | 12/2005 | Bayot et al. |

(Continued)

FOREIGN PATENT DOCUMENTS

| EP | 081556 | 6/1983 |
| JP | 2006 228312 A | 8/2006 |

(Continued)

*Primary Examiner* — Grant Sitta
(74) *Attorney, Agent, or Firm* — Baker Hostetler LLP (57) ABSTRACT

A shift register, each stage thereof provided to drive a corresponding output line, includes an output transistor that drives the output line and an additional transistor of the same technology and of the same polarity as the output transistor. The additional transistor is connected in such a way as to be subject to bias conditions similar to the output transistor, such that the additional transistor's threshold voltage, identical at the start of life to that of the output transistor, drifts as quickly or more quickly as the threshold voltage of the output transistor. The additional transistor is used to adjust the precharging voltage of a gate of the output transistor to its conduction performance characteristics during the precharging and/or selection phase.

10 Claims, 8 Drawing Sheets

(56) References Cited

U.S. PATENT DOCUMENTS

| | | |
|---|---|---|
| 7,189,496 B2 | 3/2007 | Saluel et al. |
| 7,199,396 B2 | 4/2007 | Lebrun |
| 7,319,452 B2 * | 1/2008 | Moon .......................... 345/100 |
| 7,548,283 B2 | 6/2009 | Kretz et al. |
| 2005/0008114 A1 * | 1/2005 | Moon ........................... 377/64 |
| 2006/0082716 A1 | 4/2006 | Lebrun et al. |
| 2007/0252780 A1 | 11/2007 | Lebrun |
| 2007/0274433 A1 | 11/2007 | Tobita |
| 2008/0158123 A1 | 7/2008 | Lebrun et al. |
| 2008/0231556 A1 | 9/2008 | Kretz et al. |
| 2009/0096725 A1 | 4/2009 | Kretz et al. |
| 2009/0146937 A1 | 6/2009 | Lebrun et al. |
| 2009/0167964 A1 | 7/2009 | Lebrun et al. |
| 2009/0303404 A1 | 12/2009 | Kretz |
| 2010/0019999 A1 | 1/2010 | Vaillant et al. |
| 2010/0134523 A1 | 6/2010 | Lebrun |
| 2010/0253873 A1 | 10/2010 | Kretz et al. |
| 2010/0283715 A1 | 11/2010 | Kretz et al. |

FOREIGN PATENT DOCUMENTS

| | | |
|---|---|---|
| WO | 2007/013010 A | 2/2007 |
| WO | 2009/019253 A1 | 2/2009 |
| WO | 2009/030776 A1 | 3/2009 |

* cited by examiner

FIELD-EFFECT TRANSISTOR SHIFT REGISTER

CROSS-REFERENCE TO RELATED APPLICATIONS

This application is a National Stage of International patent application PCT/EP2009/060083, filed on Aug. 4, 2009, which claims priority to foreign French patent application No. FR 08 04537, filed on Aug. 8, 2008, the disclosures of which are incorporated by reference in their entirety.

FIELD OF THE INVENTION

The present invention relates to an optimized field-effect transistor shift register, particularly suitable for controlling the selection lines of an active matrix of a flat screen such as a liquid crystal or OLED (organic light-emitting diode) screen.

BACKGROUND OF THE INVENTION

In an active matrix flat screen, each image dot is addressed by means of a switching transistor. Each selection line of the matrix is thus connected to the gates of the switching transistors of a row of image dots. These lines are therefore strongly capacitive. On each video frame, they are each selected in sequence, one by one, in a direction of scanning of the lines of the screen, during a line selection time corresponding to a fraction of the duration of the frame, enabling the video voltages to be applied to the image dots of the row.

The selection of a line thus corresponds to the application, during the corresponding line selection time, of a predetermined voltage level which controls the passing state of the switching transistors of the corresponding row of image dots. Outside the line selection time, said line is held at a voltage level capable of holding the switching transistors of the active matrix in the blocked state. Vgon and Vgoff are usually used to denote the voltage levels to be applied to the line to make these transistors passing (Vgon) and blocked (Vgoff). These levels are determined according to characteristic video voltages.

The selection lines are usually controlled by circuits that include one or more shift registers in series, each having a plurality of cascaded stages, each stage being capable of switching the levels Vgon and Vgoff at the output to a corresponding line of the matrix, according to the sequencing of the selection of the lines.

It is well known in the field of flat screens to use thin-film field-effect transistors (TFT), both for the switching transistors in the active matrix, which enable a voltage to be applied to a pixel, and for the transistors of the shift registers of the control circuits of the selection lines of this matrix.

One well-known problem encountered by the designers of such circuits is how to manage the drift in the threshold voltage of the thin-film transistors. This drift depends notably on the temperature conditions, but also on the voltage levels applied and on the current level conducted by these transistors. It conditions their lifespan.

Moreover, integrating the active matrix and the control circuits on one and the same substrate is advantageous. However, it presupposes that the control circuits take little space, above all when the matrix contains a large number of pixels.

Line control circuits have been designed to meet these various needs. In particular, the Patent Application EP 0815 562 discloses a shift register structure with a small number of field-effect transistors, of the same polarity and with a small footprint. This structure leads to a low duty cycle for the transistors, and is also designed to limit the voltage levels that are applied to them. In particular, when a stage is not active, its transistors have their gate-source voltage below or equal to zero. These transistor control conditions make it possible to improve their lifespan.

More specifically, this structure is based on the use, in each stage of an output transistor able to conduct a sufficient current to charge the output capacitive line, associated with a "bootstrap" capacitor, connected between its gate and its source. The drain of the output transistor receives a clock signal; its source forms the output node on a line of the active matrix; its gate is controlled by the bias of a precharging transistor, which brings the gate to a precharging potential making it possible to control the passing state of the output transistor at the input in the line selection phase. In the selection phase, the gate of the output transistor then follows the potential of its source via the bootstrap capacitor, which holds the transistor in the passing state throughout the line selection phase. The gate precharging potential is determined so that the output transistor conducts an output current of sufficient level to transfer a pulse of the clock signal applied to its drain, to its source which forms the output node. The gate of the output transistor is also controlled by a discharge transistor activated after the line selection phase, to bring the gate of the output transistor to a voltage level enabling it to be blocked.

Although this structure is advantageous in that it requires only a small number of transistors, controlled with a low duty cycle and low voltage levels, optimized with respect to the levels Vgon and Vgoff to be applied to the output, it does, however, exhibit a sensitivity to the drift in the threshold voltage of the output transistor, which limits its lifespan.

In practice, it has been seen that, in the selection phase, the gate potential increases with the source potential, by bootstrap effect from the capacitor connected between the gate and the source. If V1 is used to denote the precharging potential of the gate at the input in the selection phase, the gate potential then increases by a quantity Va proportional to the voltage at the output node Vgon. The gate-source voltage Vgs seen by the output transistors during each line selection phase is thus greater than the threshold voltage of the transistor. Over time, it induces a drift in the threshold voltage, which can reach ten or so volts. Because of the drift, there comes a time when the precharged voltage level V1 on the gate is no longer sufficient to make an output transistor passing, or at least sufficiently conductive to charge the capacitor of the output node or of the line. This moment marks the end of life of the shift register.

Also, depending on the lifespan desired for the control circuit, in line with the lifespan of the active matrix with which it is to be integrated, there is a need to define a precharging voltage level V1 that is greater than the precharging voltage level that would be necessary, and sufficient, at the start of life of the output transistor, to simply charge the capacitor of the line.

In practice, the precharging voltage level V1 applied by the precharging transistor is equal to the level Vgon supplied by the output node of the preceding stage, during the associated line selection time, minus the threshold voltage of the precharging transistor. Thus, it is the level Vgon that has to be overevaluated, according to the lifespan sought, to take account of the drift over time of the threshold voltage of the output transistors.

For example, a transistor whose threshold voltage at the start of life is of the order of 1 or 2 volts, can have its threshold voltage drift by approximately 13 volts. In this case, a voltage Vgon of the order of 20 volts can be chosen, whereas at the start of life, a voltage Vgon of the order of 7 volts would have been sufficient. This means that, at the start of life, the output transistor is then extremely conductive. The excessive output current tends to accelerate the speed with which the threshold voltage of the output transistor will drift. Its lifespan is hence diminished.

For each target application or product, the design of such a register must thus take account of three criteria:

The minimum current level that the control transistor must be capable of supplying to charge the output line. This will depend notably on the type of screen involved, in particular on the number of image dots per line and the technology used. This minimum current level defines the end of life of the transistor: starting from the first time the product (i.e. the screen) is started up, the end of life is marked by the moment when the output transistor will no longer be capable of supplying this minimum current.

The speed of drift of the threshold voltage of the output transistor, which is a function of the voltage level applied to its gate, and its technology.

The maximum level Vgon that can be applied to the control circuit, which is a function of the screen controller concerned.

SUMMARY OF THE INVENTION

The object of the invention is to improve the lifespan of the shift registers.

One idea on which the invention is based is to improve the control of their output transistors, by adapting the precharging voltage level of their gate, to their level of conduction, that is to say, to their threshold voltage, so that it is less high at the start of life than at the end of life. Consequently, in the line selection phase, the gate-source voltage of the output transistor will be lower at the start of life than at the end of life, and adapted to the correct conduction level of the output transistor.

The technical solution provided by the invention lies in the use, for each output transistor, of a transistor of the same technology, produced at the same time as it, and whose threshold voltage will drift over time at least as quickly as its own, to adapt the level of the precharging voltage to its threshold voltage.

The invention provides a shift register produced using field-effect transistors of the same polarity, the shift register including a plurality of cascaded identical stages, the stages of even rank receiving a clock signal and the stages of odd rank receiving a complementary clock signal and the stages being sequenced to transmit, one after the other, a clock pulse to an output node, during a corresponding line selection phase, each stage including:

an output transistor, the gate of which is connected to an internal node, the source of which forms the output node of the stage, and the drain of which receives the clock signal for the stage, and including a capacitor connected between its gate and its source, a first control transistor connected to the internal node, capable of bringing the internal node to a precharging voltage during a precharging phase preceding the line selection phase, such that the output transistor is passing during the line selection phase, a second control transistor connected to the internal node, capable of bringing the internal node to an output transistor blocking voltage, in a deselection phase following the line selection phase, and a capacitor connected to the internal node and controlled by the complementary clock signal of the clock signal applied to the drain of the output transistor.

Each stage includes an additional transistor of the same technology and of the same polarity as the output transistor, the drain of which is connected to the internal node, and the source of which is biased to an output transistor blocking voltage at least during the precharging phase, and the function of which is to adjust the voltage to the internal node according to the conduction performance characteristics of the output transistor during the precharging and/or phase of selection of the stage.

The optimization of the precharging voltage to the level of conduction of the output transistor obtained applies throughout the period of use, from start to end of life: as the circuit is used, the additional transistor becomes increasingly less active to limit the precharging voltage. It will be shown that this optimization also applies for the usage temperature.

The invention applies to an active matrix flat screen. In particular, it allows for the integration, on one and the same substrate, and with the same transistor technology, of the matrix and of the control circuit of the selection lines.

BRIEF DESCRIPTION OF THE DRAWINGS

Other benefits and features of the invention are detailed in the following description, with reference to the illustrated drawings of an embodiment of the invention, given by way of nonlimiting example. In these drawings.

DETAILED DESCRIPTION

The invention applies generally to the shift registers produced using field-effect transistors of the same polarity. It is described more particularly, without being limited thereto, in the context of registers that use thin-film transistors TFT, for example based on amorphous silicon, particularly advantageous for controlling the active matrix selection lines of a flat screen.

Figure 1:
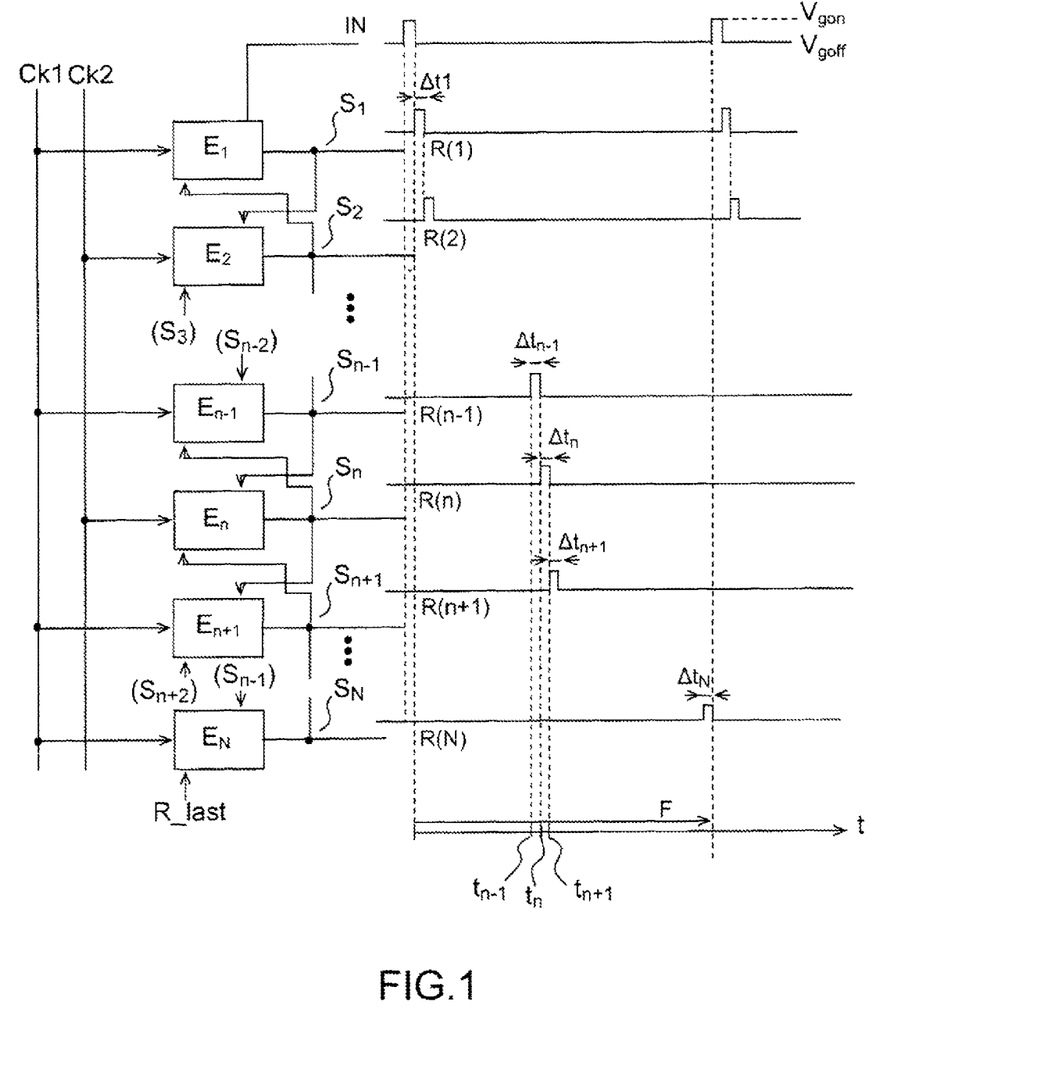
FIG. 1 is a general diagram of a line control shift register of an active matrix.
Figure 2A:
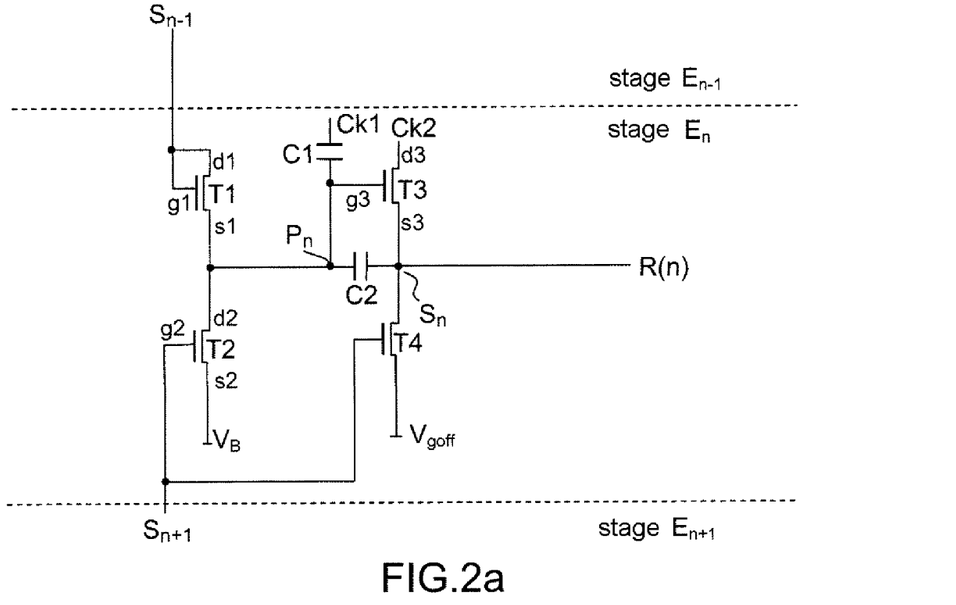
FIG. 2a details a structure of a stage of a shift register according to the state of the art, to which the invention can be applied.
Figure 2B:
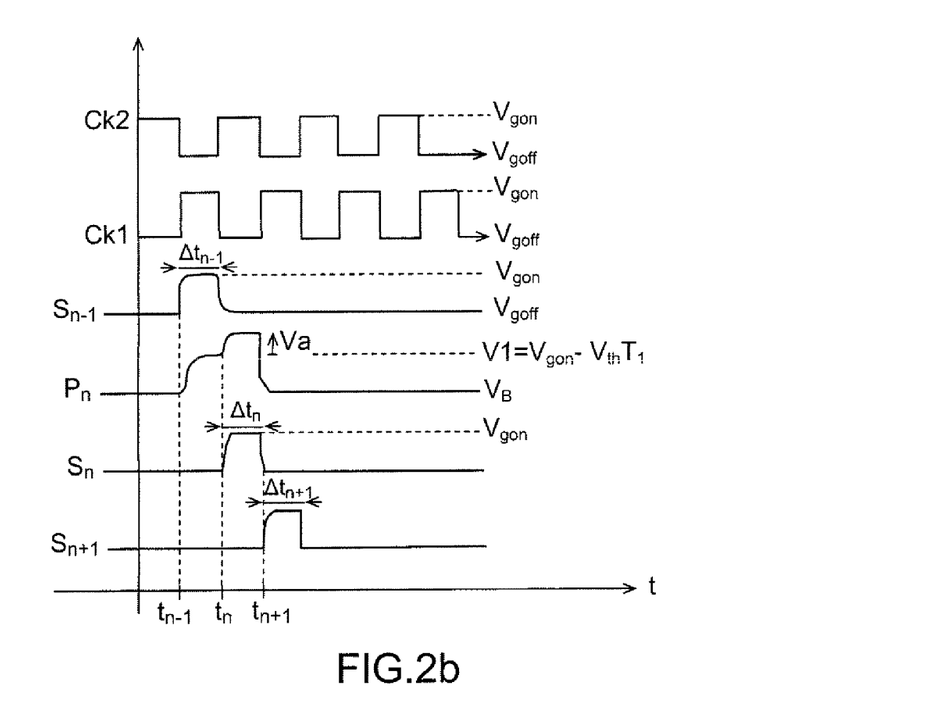
FIG. 2b is a timing diagram of the signals illustrating the operation of such a register.

As is well known, and as illustrated in FIG. 1, a shift register comprises N cascaded identical stages $E_1$ to $E_N$. The stages of even rank $E_1$, $E_{n-1}$, $E_{n+1}$, ... $E_N$, receive a clock signal Ck1. The stages of odd rank $E_2$, $E_n$, receive a complementary clock signal Ck2. The high and low levels of these clock signals are the levels Vgon and Vgoff. They are illustrated in FIG. 2b.

The first stage $E_1$ receives a line scanning signal IN (vertical scan) transmitting a clock pulse for each new video frame F to be displayed. This pulse of the signal IN will be "propagated" to the output $S_1$ of the first stage $E_1$, then from line to line, on the outputs of the stages $E_1, E_2, \ldots E_n, \ldots E_N$, so that the lines R(1) to R(N) are selected one after the other, during a corresponding line selection phase, $\Delta t_1, \Delta t_2, \ldots \Delta t_n, \ldots \Delta t_N$, once per frame F.

A basic structure of a stage $E_n$ of such a shift register, as disclosed in the abovementioned European application, comprises (FIG. 2a):

An output transistor T3, the gate g3 of which is connected to an internal node $P_n$; the source s3 of which forms the output node $S_n$ of the stage; and the drain d3 of which receives the clock signal for the stage, Ck2 in the example. It includes a capacitor C2 connected between its gate and its source: this is the "bootstrap" capacitor.

A first control transistor T1 connected to the internal node $P_n$ by its source able to bring this internal node to a precharging voltage V1, during a precharging phase (or a line time) preceding the line selection phase; the precharging voltage V1 is such that the output transistor is passing during the line selection phase.

A second control transistor T2 connected to the internal node, able to bring said internal node to a blocking voltage $V_B$ of the output transistor T3 in a phase following the line selection phase. This output transistor blocking voltage is defined in practice to maintain a sufficiently low gate voltage level for the leakage current in the output transistor not to be able to charge the line capacitor. This blocking voltage must thus typically be chosen to be less than or equal to the source voltage of the output transistor (Vgoff) plus its threshold voltage. It is possible, for example, to choose $V_B$ to be equal to Vgoff. Its optimum level typically depends on the conduction threshold of the transistors.

The transistors T1 and T2 are advantageously controlled (by their gate), the first, T1, by the signal supplied by the output node $S_{n-1}$ of the preceding stage $E_{n-1}$ or by the line scanning signal IN in the case of the transistor T1 of the first stage $E_1$ (FIG. 1), the second, T2, by the signal supplied by the output node $S_{n+1}$ of the next stage $E_{n+1}$ or by an end-of-line scanning signal R_last in the case of the transistor T1 of the last stage $E_N$ (FIG. 1).

In the example, the gate g1 and the drain d1 of the transistor T1 are connected in common to the output node Sn−1. The transistor T2 has its gate connected to the output node $S_{n+1}$, its drain d2 to the internal node $P_n$, and its source to a blocking voltage denoted $V_B$.

To obtain optimum operation, another transistor T4 is also generally provided, connected to the output node $S_n$ and with its source connected to the blocking voltage of the switching transistors of the matrix, that is to say, Vgoff. Its gate is connected to the output node $S_{n+1}$ of the next stage R(n+1). Its function is to facilitate the discharging of the output node $S_n$, at the end of the line selection phase, by pulling it to Vgoff. It will be noted that the blocking voltages $V_B$ and Vgoff are not necessarily equal and can be brought by separate power supply buses, in particular for isolation purposes.

In this structure, it is also known to provide means of compensating the effects of the spurious gate-drain capacitance of the output transistor T3 during the switchings of the clock signal applied to the drain d3. In the invention, a capacitor C1 is used for this function, connected to the internal node $P_n$ and controlled by the complementary clock signal of the clock signal applied to the drain d3 of the output transistor, therefore Ck1 in the example.

The US Application 2005/0008114A1, published 13 Jan. 2005, discloses a shift register in which this compensation function is handled by a transistor (Q5, FIG. 3), the gate of which is controlled at high frequency, by the same clock that drives the drain of the output transistor. For each display frame, this compensation transistor is thus activated for every other line, which is not without influence on its lifespan. Furthermore, the dimensioning of this transistor must be studied closely to avoid having a screening effect of the "bootstrap" effect type on the internal node $P_n$.

From one stage to the next, the roles of the clock signals Ck1 and Ck2 are exchanged: for example, in the stages $E_{n-1}$ and $E_{n+1}$, the transistor T3 receives the signal Ck1 and the capacitor C1 receives the clock signal Ck2 (not illustrated).

The operation of such a stage $E_n$ of the register will now be explained briefly.

FIG. 2b is a timing diagram showing the different signals involved. The clock signals Ck1 and Ck2 are complementary, i.e. in phase opposition. The high level Vgon of the clock pulses is defined so that the switching transistors of the active matrix are capable of losslessly charging the video voltage levels to be applied to the pixel electrodes, and to allow for the switching to the passing, and sufficiently conductive, state of the output transistors T3 of the stages of the shift register, at the end of life. Vgon for example=20 volts. The low level Vgoff of the pulses is defined to be able to block these switching transistors. Vgoff is, for example=−7 volts.

The selection phase $\Delta t_{n-1}$ of the line R(n−1) begins at the time $t_{n-1}$ and ends at the time $t_n$. The selection phase $\Delta t_n$ of the line R(n) begins at the time $t_n$ and ends at the time $t_{n+1}$, and so on.

During the selection phase $\Delta t_{n-1}$ of the line R(n−1), between $t_{n-1}$ and $t_n$, the clock signals Ck1 and Ck2 are respectively in the high state Vgon and in the low stage Vgoff. The output node $S_{n-1}$ is at the high level Vgon: the transistor T1 of the stage $E_n$ is passing and charges the control node $P_n$ of the gate g3, to the precharging voltage level V1=Vgon−VtT1, in which VtT1 is the threshold voltage of the transistor T1.

At the time $t_n$, the state of the clock signals Ck1 and Ck2 is reversed: Ck1 changes to the low stage Vgoff and Ck2 changes to the level Vgon. The output node $S_{n-1}$ changes to Vgoff, which leads to the blocking of the transistor T1 of the stage $E_n$.

Since the internal node $P_n$ has been charged to the precharging voltage level V1=Vgon−VtT1, the transistor T3 is passing. Since Ck2 is in the high state Vgon, the source s3 follows, bringing with it the gate g3 of the transistor T3, which is floating, thanks to the capacitor C2. The transistor T3 is then largely conductive throughout the duration of the line time $\Delta t_n$ and the output node $S_n$ perfectly follows the clock signal Ck2, until its descent at the time $t_{n+1}$. At this moment, the output node $S_{n+1}$ of the next line rises, making the transistors T2 and T4 of the stage $E_n$ passing: the internal node $P_n$ and the output node $S_n$ are each pulled to a blocking voltage, respectively $V_B$ and Vgoff. The capacitor C2 is discharged. The line R(n) is deselected.

When Ck1 rises again to Vgon and Ck2 falls to Vgoff, the sequence is repeated for the next stage $E_{n+1}$, replacing n−1 with n, n with n+1, Ck1 with Ck2 and vice versa.

The scanning sequence of the lines of the matrix begins with the activation of the scanning control signal IN, which precharges the internal node $P_1$ of the first stage. The signal R_last is used to discharge the internal node $P_N$ and the output node $S_N$ of the last stage, marking the end of the selection phase of the associated line R(N) and the end of the video frame. The line scan recommences on the first line, for the next video frame.

According to the invention, a transistor T5 is used in each stage that is of the same technology and of the same polarity, manufactured during the same manufacturing steps as the output transistor T3, so that it has substantially the same threshold voltage at the start of life (technological deviations apart) as this output transistor, to adapt the gate voltage of this output transistor to its conduction performance characteristics, during the precharging and/or selection phase of the stage concerned.

Thus, according to the invention, each stage $E_n$ of the shift register comprises an additional transistor, that will be denoted T5, of the same technology, of the same polarity as the output transistor T3. The drain d5 of this additional transistor is connected to the internal node $P_n$, and its source s5 is connected to a blocking voltage for the output transistor T3 at least in the precharging phase. The function of this additional transistor is to adjust the voltage to the internal node $P_n$, which is connected to the gate of the output transistor T3, according to the conduction performance characteristics of said output transistor T3, during the precharging and/or selection phase of the stage concerned.

This function can be obtained according to various embodiments, in particular with different variants of connection of the gate and of the source of this additional transistor. In all these embodiments, the connections of the transistor T5 provide polarization conditions such that its threshold voltage drifts at least as quickly as that of the output transistor, which is used to adapt the precharging voltage to the conduction conditions of the output transistor.

Figure 3:
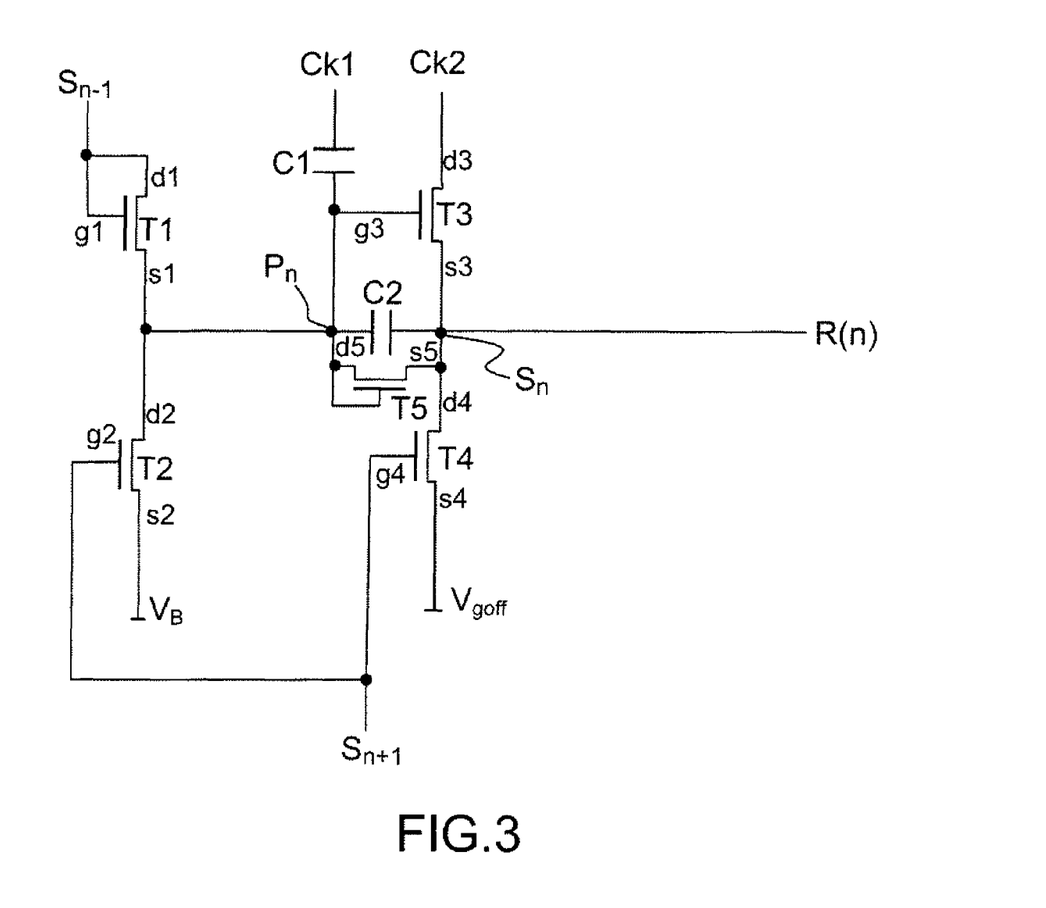
FIG. 3 illustrates a first embodiment of a stage of such a shift register according to the invention.

FIG. 3 illustrates a first embodiment. In this embodiment, and as indicated hereinabove, the drain d5 of the additional transistor T5 is connected to the internal node $P_n$, and the source s5 is linked to the source s3 of the output transistor T3. The gate g5 of the transistor T5 is linked to the gate g3 of the transistor T3 (at the node $P_n$).

In these conditions, the transistor T5 is polarized with the same gate-source voltage as the output transistor T3, throughout the duration of the frame: its threshold voltage drifts like that of the output transistor T3.

Thus, adapting the precharging voltage level according to the threshold voltage of the transistor T5 is equivalent to adapting the level of the precharging voltage according to the threshold voltage of the transistor T3: the transistor T5 is used as a measure of the variation of the threshold voltage of the output transistor T3, to adapt the level of the precharging voltage. In other words, the less the transistor T3 is able to conduct, the less the transistor T5 conducts and the less it discharges the gate, so as to enable the conduction of the transistor T3 to be maintained.

To give more detail, the operation will thus be as follows, with reference to FIGS. 2b and 3:

At the start of life, the threshold voltage of the transistors T3 and T5 is at its nominal value, specific to the technology. It is, for example, 1 or 2 volts.

During the precharging phase $\Delta t_{n-1}$ of the stage $E_n$, between the times $t_{n-1}$ and $t_n$, Vgon is applied to the drain d1 of the transistor T1 (node $S_{n-1}$) and Vgoff is applied to the source of the transistor T5 (node $S_n$). The transistor T1 starts to conduct, and causes the voltage to rise at the node $P_n$.

At the start of life, the transistor T5 will start to conduct rapidly, as soon as the voltage at the node $P_n$ exceeds its threshold voltage. It becomes more and more conductive as the node $P_n$ rises. The current drawn by the transistor T5 therefore tends to slow down the rising of the node $P_n$. T1 and T5, which conduct in series, thus form a divider bridge at the node $P_n$ between Vgon and Vgoff. This divider bridge limits the voltage rise of the node $P_n$ to a value V1' at the time $t_n$, which can be expressed:

$$V(P_n)(t_n)=V1'=(R5/(R5+R1))\cdot(Vgon-VtT1-Vgoff)$$

in which R1 and R5 are the respective impedances of T1 and T5.

Without the transistor T5, the precharging voltage of the node Pn, at the instant $t_n$, would be: $V(P_n)(t_n)=V1=Vgon-VtT1$.

Figure 4:
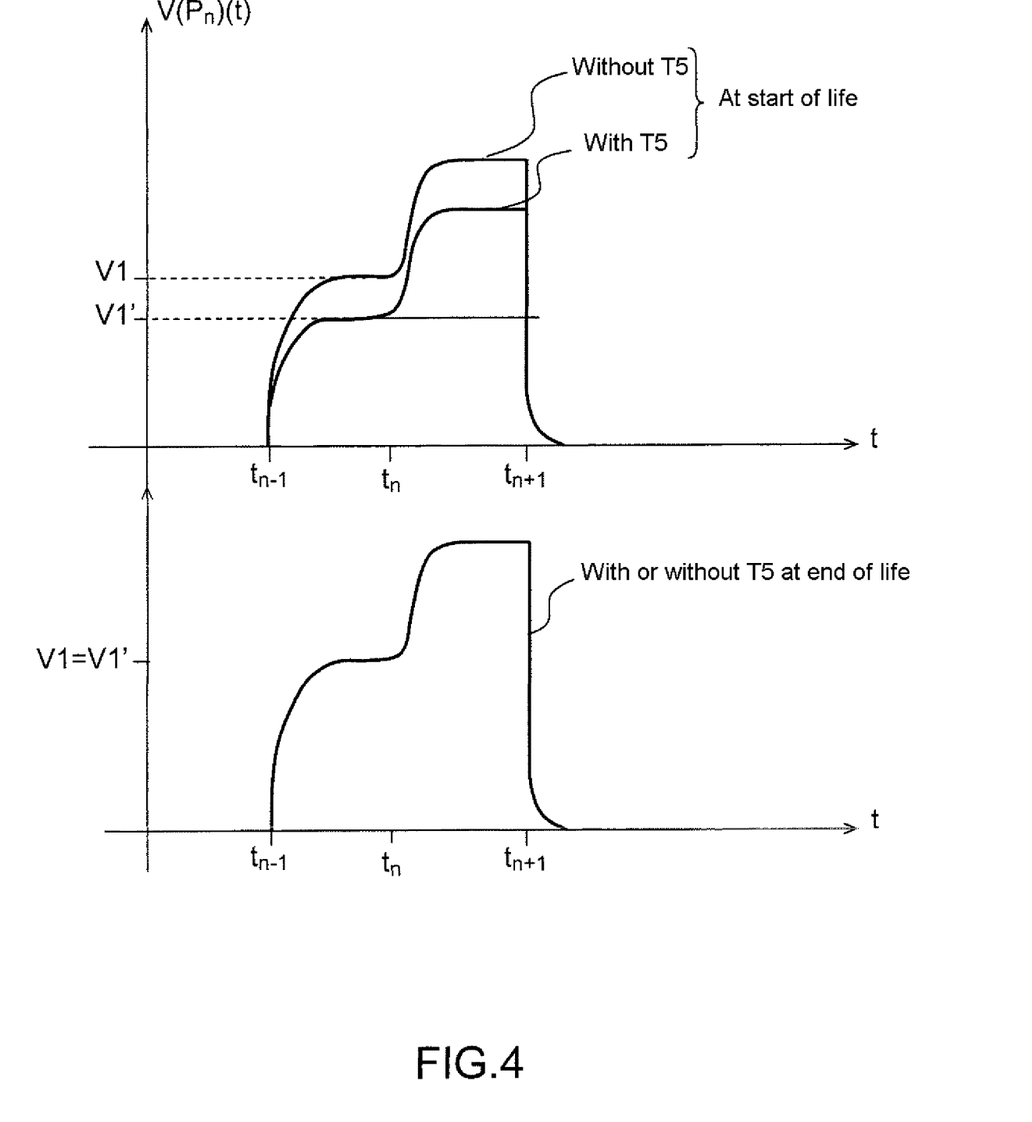
FIG. 4 shows the different curves of the voltage at the gate node of the output transistor of a stage at the start of life and at the end of life, according to the state of the art and according to the invention.

The two precharging curves $V_A(P_n)$ (t) of the node $P_n$ with or without transistor T5 at the start of life are illustrated in FIG. 4. Without T5, the node $P_n$ rises to V1. With T5, the rise of the node $P_n$ is limited to V1'<V1. This potential V1' is sufficient to make the transistor T3 passing and sufficiently, but not excessively, conductive to transmit the level Vgon of the clock signal applied to its drain, to its source, during the next selection phase $\Delta t_n$ of the line R(n), between $t_n$ and $t_{n+1}$. In this selection phase, the voltage at the node $P_n$ rises with the source s3 of the transistor T3 (the effect of the capacitor C2), by a quantity Va, which is substantially the same in both cases (with or without T5).

In the case of selection between $t_n$ and $t_{n+1}$, the transistor T5 mounted as a diode continues to conduct, thus continuing to discharge the node Pn and therefore limit the stress.

At the end of life, the threshold voltage of the transistor T5 which will have drifted at least as much as that of the output transistor, is much higher. For example, it will have drifted by 10 volts. For this reason, the transistor T5 has a series impedance that is high compared to that of T1. This high series impedance of the transistor T5 has the effect of reducing the difference between the voltage V1' and the voltage V1 that would have been obtained without the transistor T5 of the invention, in the precharging phase. In other words, at the end of life, the precharging curve $V(P_N)(t)$ is substantially the same with or without transistor T5: V1'=V1, as illustrated in FIG. 4. The node $P_n$ will be able to rise in voltage, with no limiting effect. In these conditions, at the time $t_n$, $V(P_n)(t_n)=V1=Vgon-Vgoff$.

In practice, the dimensions of the transistor T5 are determined so as to no longer influence the charging of the internal node $P_n$ at the end of life.

The transistor T5 according to the invention makes it possible to obtain a circuit that has a longer lifespan with constant Vgon, compared to the same circuit without the transistor T5.

The transistor T5 also makes it possible to optimize the control of the output transistor T3 to the temperature conditions.

In practice, at high temperature, the mobility of the transistors is greater, and the threshold voltage lower than at low temperature. At high temperature, the discharging of the internal node $P_n$ will thus be more effective, the mobility of the transistor T5 being greater and the voltage at the node $P_n$ at the end of the precharging will thus be lower, perfectly suited to the threshold voltage of the output transistor.

At low temperature, the mobility is reduced and the threshold voltage increases. The transistor T5, with reduced mobility, will be largely ineffective in discharging the internal node $P_n$ (high series impedance) which consequently will reach a precharging level at the time $t_n$ that is higher, allowing for a better conduction of the output transistor T3.

In the embodiment of FIG. 3, the transistors T3 and T5 have their gates linked together and their sources linked together: they thus see the same gate-source voltage, regardless of the phase concerned. The drifts of these threshold voltages are substantially identical (technological dispersions apart).

Figure 5:
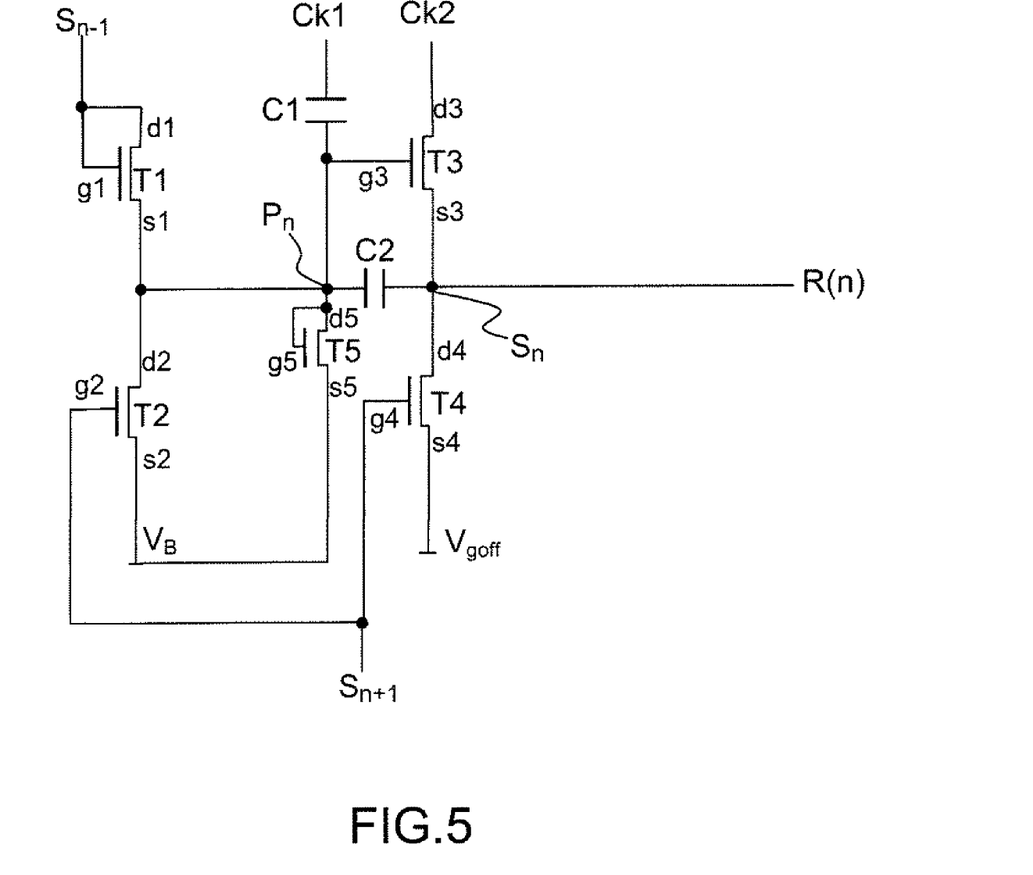
FIG. 5 illustrates a second embodiment of the invention.

In a second embodiment of the invention illustrated in FIG. 5, the transistor T5 has its source s5 not connected to the source s3 of the output transistor, but to a constant voltage, for blocking the output transistor. In the example illustrated in FIG. 5, the source s5 is thus connected to the source s2 of the transistor T2. In a variant, the source s5 can be polarized to a blocking voltage corresponding to the low voltage level Vgoff of the clock signals, typically by connecting the source s5 to the source s4 of the transistor T4.

In this embodiment, the transistors T3 and T5 always have their gates g3 and g5 connected together, at the same potential; but the source of the transistor T5 is permanently polarized to a blocking voltage $V_B$, less than or equal to Vgoff, which is the low level of the clock signal, whereas the source of the transistor T3 is polarized to Vgon during the line selection time $\Delta t_n$ and Vgoff the rest of the time. The gate-source voltage seen by the transistor T5 is thus overall higher over the frame time. Its threshold voltage will therefore drift more quickly than that of the transistor T3. This makes it possible to adapt the conduction of the transistor T5 according to the drift in the threshold voltage of T3. This variant embodiment makes it possible to make the dimensioning of the transistor T5 more simple compared to the other transistors of the circuit, because it does not cause any modification of the polarity of the line in the precharging phase (no precharging of the line via the conduction path T1-T5) and also because its threshold voltage will drift more quickly.

Figure 6:
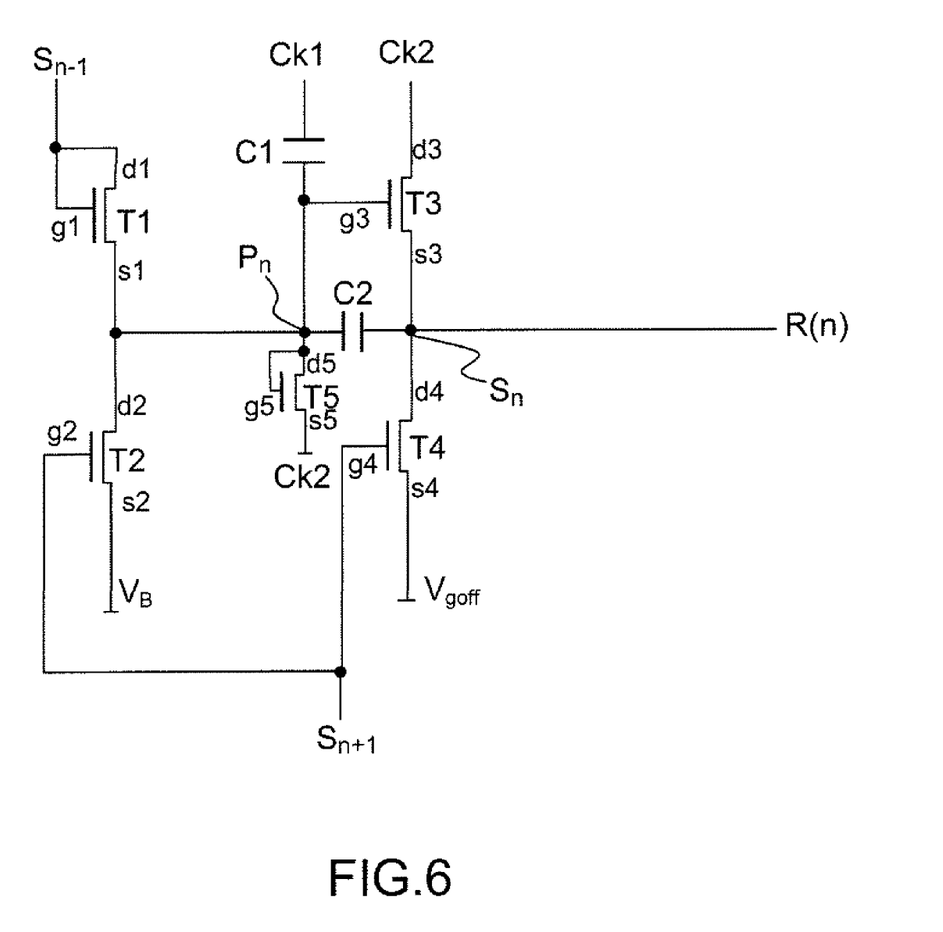
FIG. 6 illustrates a variant of this embodiment.

In another embodiment illustrated in FIG. 6, the transistor T5 has its source s5 connected to the drain d3 of the output transistor, that is to say, to the clock signal Ck2 which drives this drain. In the precharging phase, between $t_{n-1}$ and $t_n$, its source s5 is thus held at the low level Vgoff of the clock signal Ck2, whereas in the selection phase, between $t_n$ and $t_{n+1}$, its source s5 is thus held at the high level Vgon of the clock signal Ck2. In these two phases, the gate-source voltage of the transistor T5 is substantially equal to that of the transistor T3. In the other phases of the frame F, the source of this transistor T5 follows the clock signal. The drift in their threshold voltage (i.e. T3 and T5) will be substantially the same.

Figure 7:
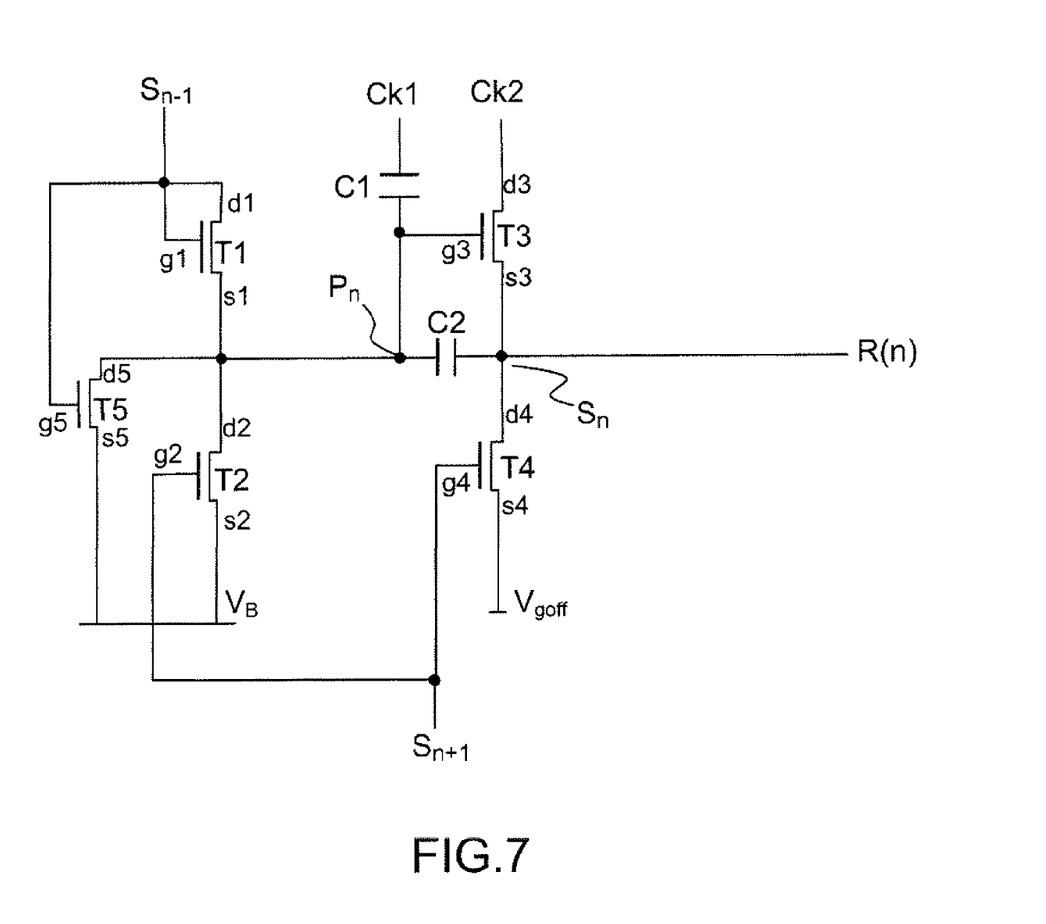
FIG. 7 illustrates a third embodiment of the invention.

Another embodiment is illustrated in FIG. 7. In this variant, the gate g5 of the transistor T5 is linked to the gate g1 of the transistor T1. In the embodiment illustrated (FIG. 6) the source s5 of the transistor T5 is linked to the source s2 of the transistor T2, to the blocking voltage $V_B$ of the output transistor T3. The source s5 of the transistor T5 could also be polarized to the blocking voltage Vgoff of the switching transistors (low level of the clock signals). In the example illustrated, this would typically be obtained by connecting its source s5 to the source s4 of the transistor T4.

In this embodiment, the transistor T5 is activated and blocked at the same time as the transistor T1. It is therefore active only in the precharging phase (which is also the selection phase for the preceding line), between the times $t_{n-1}$ and $t_n$. This embodiment makes it simpler to determine the respective sizes of the transistors T1 and T5, to determine the voltage V1'. These respective sizes of the transistors T1 and T5 are chosen according to the voltage V1' that is desired at the node $P_n$ at the end of the precharging phase, at the start of life of the circuit. The transistor T5 is less and less active as the circuit ages.

In this embodiment, the transistor T5 is polarized to a gate-source voltage equal to Vgon (voltage on its gate) minus $V_B$, during the time $\Delta t_{n-1}$, and to a voltage equal to Vgoff minus $V_B$ for the rest of the frame. When active, and during the time $\Delta t_n$, the transistor T3 is polarized with a gate-source voltage equal to V1'+Va (its gate voltage) minus Vgon (its source voltage). This voltage is less than or equal to that of the transistor T5 in the active state. For these reasons, the threshold voltage of the transistor T5 will drift in the same way or more quickly than that of the transistor T3.

Figure 8:
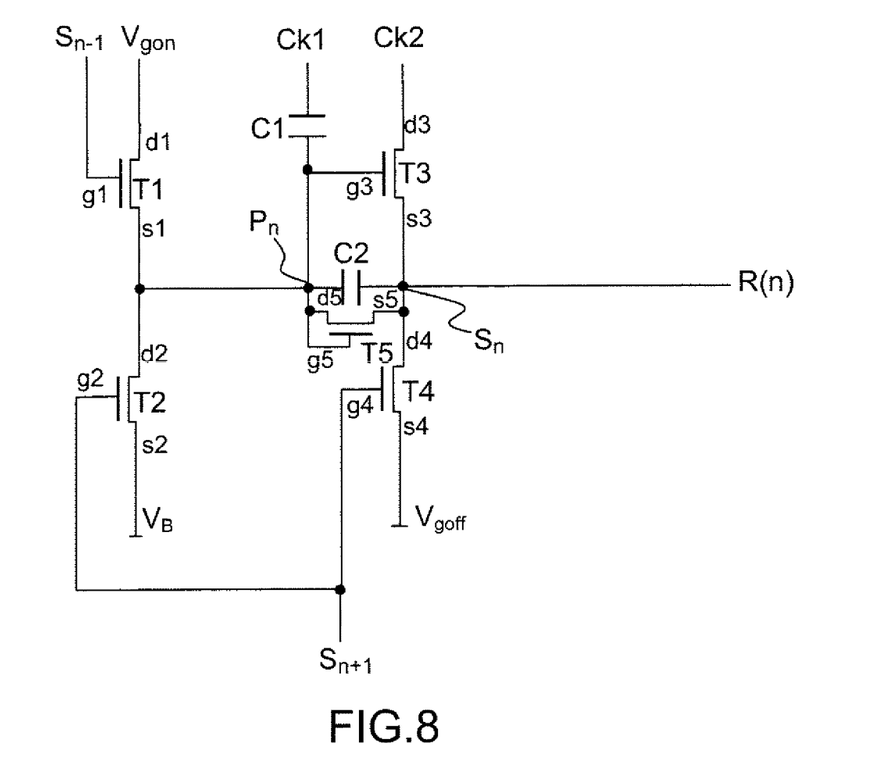
FIG. 8 illustrates a control variant applicable to the various embodiments of the invention illustrated in FIGS. 3, 5 and 6.

FIG. 8 illustrates a refinement of the invention, applicable to the various embodiments already described. It is explained by referring once again to the embodiment illustrated in FIG. 3.

In this refinement, the drain d1 of the transistor T1 is no longer connected to the gate of g1. It is linked to the voltage Vgon. This electrical scheme makes it possible to avoid a voltage drop on the output node $S_{n-1}$ of the preceding stage $E_{n-1}$, when the transistors T1 and T5 of the stage $E_n$ conduct, in the precharging phase, that is to say when the node $S_{n-1}$ is at Vgon.

A power supply bus is then provided in practice to bring the voltage Vgon to each of the stages of the control circuit.

The invention makes it possible to increase the lifespan of the screen, by providing better management of the drift in the threshold voltage of the field-effect transistors of the control circuit, regardless of the technology concerned (thin films, MOS, etc.).

Figure 9:
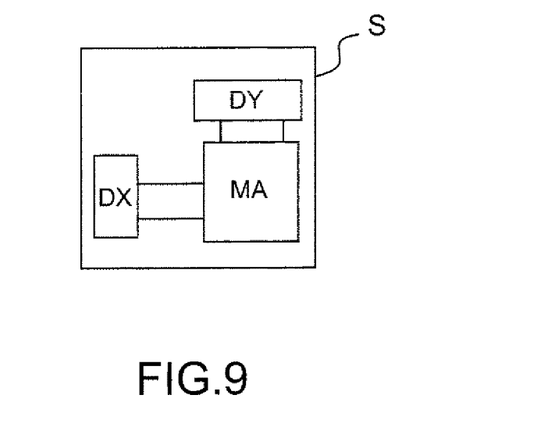
FIG. 9 diagrammatically illustrates an active matrix substrate with integrated control circuits.

It advantageously applies to flat screens, notably liquid crystal or OLED flat screens, of active matrix type. It is of particular interest when the line (and column) control circuits are produced on the same substrate as the active matrix, as diagrammatically illustrated in FIG. 9: on one and the same substrate S of the screen, there are produced the active matrix MA, that is the pixel electrodes and their associated switching devices, and a line control circuit DX, produced according to the invention.

The invention claimed is:

1. A shift register including field-effect transistors of the same polarity, the shift register comprising a plurality of cascaded identical stages, the stages of even rank receiving a first clock signal and the stages of odd rank receiving a second clock signal complementary to said first clock signal, and the stages being sequenced through an input signal applied on an input node of a stage to transmit, one after the other, a clock pulse to an output node of said stage during a corresponding line selection phase for said stage, each respective stage comprising:

an output transistor, a gate of which is connected to an internal node, a source of which forms said output node of the stage, and a drain of which receives one of said first and second clock signals, wherein a first capacitor is connected between the gate of the output transistor and the source of the output transistor, a first control transistor having a source connected to said internal node, a gate connected to the input node of the stage, said input node connected to an output node of an immediately preceding stage, and said first control transistor configured to bring said internal node to a precharging voltage in a precharging phase corresponding to the line selection phase of said immediately preceding stage, whereby the output transistor is passing during said line selection phase of the respective stage, a second control transistor having a drain connected to said internal node, wherein the second control transistor is configured to bring said internal node to an output transistor blocking voltage, in a deselection phase following said line selection phase, and a second capacitor connected to said internal node and controlled by the other of said first and second clock signals, wherein said respective stage comprises an additional transistor of the same technology and of the same polarity as said output transistor, said additional transistor mounted as a diode with a drain and a gate permanently connected together to said internal node, and a source connected to one of the source of the output transistor, the drain of the output transistor or a blocking biasing voltage.

2. The shift register according to claim 1, wherein the source of said additional transistor is connected to the source of said second transistor.

3. The shift register according to claim 1, wherein the source of said additional transistor is biased to a blocking biasing voltage, wherein said blocking biasing voltage corresponds to the low level of the clock signals.

4. The shift register according to claim 1, wherein said first transistor having its gate connected to the input node of the stage is mounted as a diode with its gate connected to its drain, and wherein the input signal applied to said input node is at a high level of the pulses of the clock signal during the precharging phase of the stage, and at the low level otherwise.

5. The shift register according to claim 1, wherein the input signal applied to the input node of the stage is at a high level of the pulses of the clock signal during the precharging phase of the stage, and at the low level otherwise, and wherein a drain of said first control transistor receives a constant voltage, corresponding to said high level.

6. An active matrix flat screen, comprising matrix selection lines and a shift register according to claim 1 for driving the matrix selection lines.

7. The active matrix flat screen according to claim 6, wherein the transistors of said register and the transistors of said active matrix are of the same technology on one and the same substrate.

8. A shift register including field-effect transistors of the same polarity, the shift register comprising a plurality of cascaded identical stages, the stages of even rank receiving a first clock signal and the stages of odd rank receiving a second clock signal complementary to said first clock signal, and the stages being sequenced through an input signal applied on an input node of a stage to transmit, one after the other, a clock pulse to an output node of said stage during a corresponding line selection phase for said stage, each respective stage comprising:

an output transistor, a gate of which is connected to an internal node, a source of which forms said output node of the stage, and a drain of which receives one of said first and second clock signals, wherein a first capacitor is connected between the gate of the output transistor and the source of the output transistor, a first control transistor having a source connected to said internal node, a gate connected to the input node of the stage, said input node connected to an output node of an immediately preceding stage, and said first control transistor configured to bring said internal node to a precharging voltage in a precharging phase corresponding to the line selection phase of said immediately preceding stage, whereby the output transistor is passing during said line selection phase of the respective stage, a second control transistor having a drain connected to said internal node, wherein the second control transistor is configured to bring said internal node to an output transistor blocking voltage, in a deselection phase following said line selection phase, and a second capacitor connected to said internal node and controlled by the other of said first and second clock signals, wherein said respective stage comprises an additional transistor of the same technology and of the same polarity as said output transistor, said additional transistor having a drain connected to said internal node, a source connected to a blocking biasing voltage, and a gate connected to said input node of the stage.

9. The shift register according to claim 8, wherein the source of said additional transistor is connected to the source of said second transistor.

10. The shift register according to claim 8, wherein the source of said additional transistor is biased to a blocking biasing voltage corresponding to a low level of the clock signals.

\* \* \* \* \*